US009786527B2

(12) United States Patent
Shibayama

(10) Patent No.: US 9,786,527 B2
(45) Date of Patent: Oct. 10, 2017

(54) SUBSTRATE PROCESSING DEVICE AND SUBSTRATE PROCESSING METHOD FOR CARRYING OUT CHEMICAL TREATMENT FOR SUBSTRATE

(71) Applicant: SCREEN Holdings Co., Ltd., Kyoto (JP)

(72) Inventor: Nobuyuki Shibayama, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 0 days.

(21) Appl. No.: 15/442,833

(22) Filed: Feb. 27, 2017

(65) Prior Publication Data

US 2017/0170032 A1    Jun. 15, 2017

Related U.S. Application Data

(62) Division of application No. 13/953,964, filed on Jul. 30, 2013, now abandoned.

(30) Foreign Application Priority Data

Aug. 20, 2012 (JP) ................. 2012-181540

(51) Int. Cl.
H01L 21/67     (2006.01)
H01L 21/687    (2006.01)
H01L 21/02     (2006.01)

(52) U.S. Cl.
CPC .... *H01L 21/6708* (2013.01); *H01L 21/02035* (2013.01); *H01L 21/67109* (2013.01); *H01L 21/68792* (2013.01)

(58) Field of Classification Search
None
See application file for complete search history.

(56) References Cited

U.S. PATENT DOCUMENTS 5,288,333 A    2/1994  Tanaka et al.
5,443,648 A    8/1995  Ohkase
(Continued)

FOREIGN PATENT DOCUMENTS

JP    11-111673    4/1999
JP    2001-077069  3/2001
(Continued)

OTHER PUBLICATIONS

Office Action issued by Korean Patent Office on Nov. 17, 2014 in connection with corresponding Korean Patent Application No. 2011-063736 and partial Japanese and English translations thereof.

(Continued)

*Primary Examiner* — Allan Olsen
(74) *Attorney, Agent, or Firm* — Ostrolenk Faber LLP

(57) ABSTRACT

It is an object to reduce a chemical treating width in a peripheral edge part of a substrate while suppressing deterioration in each of uniformity of the chemical treating width and processing efficiency. In order to achieve the object, a substrate processing device for carrying out a chemical treatment for a substrate using a processing liquid having a reaction rate increased with a rise in temperature includes a substrate holding portion, a rotating portion for rotating the substrate held in the substrate holding portion in a substantially horizontal plane, a heating portion for injecting heating steam to a central part of a lower surface of the substrate to entirely heat the substrate, and a peripheral edge processing portion for supplying the processing liquid from above to a peripheral edge part of the substrate heated by the heating portion, thereby carrying out a chemical treatment for the peripheral edge part.

7 Claims, 7 Drawing Sheets

(56) References Cited

U.S. PATENT DOCUMENTS

| | | | |
|---|---|---|---|
| 6,409,838 B1 | 6/2002 | Sakai | |
| 6,805,769 B2 | 10/2004 | Okuda et al. | |
| 6,942,737 B2 | 9/2005 | Sato | |
| 7,182,821 B2 | 2/2007 | Izumi et al. | |
| 8,118,945 B2 | 2/2012 | Eitoku | |
| 8,361,240 B2 | 1/2013 | Hashimoto | |
| 8,535,855 B2 | 9/2013 | Sakai et al. | |
| 8,828,183 B2 | 9/2014 | Namba et al. | |
| 8,887,741 B2 | 11/2014 | Higashijima et al. | |
| 9,536,761 B2 * | 1/2017 | Amano | H01L 21/6715 |
| 2002/0051644 A1 * | 5/2002 | Sugimoto | H01L 21/67028 396/564 |
| 2004/0216841 A1 | 11/2004 | Ito et al. | |
| 2005/0115671 A1 | 6/2005 | Araki | |
| 2005/0236018 A1 | 10/2005 | Nagami | |
| 2007/0113874 A1 | 5/2007 | Izumi et al. | |
| 2008/0035610 A1 | 2/2008 | Miya et al. | |
| 2008/0176002 A1 | 7/2008 | Tsutsumi et al. | |
| 2010/0095981 A1 | 4/2010 | Kamikawa | |
| 2011/0155177 A1 * | 6/2011 | Tamura | H01L 21/02057 134/18 |
| 2011/0240601 A1 | 10/2011 | Hashizume et al. | |
| 2011/0287346 A1 | 11/2011 | Sakai et al. | |
| 2012/0064256 A1 | 3/2012 | Higashijima et al. | |
| 2012/0160277 A1 * | 6/2012 | Higashijima | H01L 21/6708 134/33 |
| 2012/0223054 A1 | 9/2012 | Azuma et al. | |
| 2013/0171831 A1 | 7/2013 | Namba | |
| 2014/0231012 A1 * | 8/2014 | Hinode | C09K 13/04 156/345.23 |
| 2014/0231013 A1 * | 8/2014 | Hinode | C09K 13/04 156/345.23 |
| 2014/0356539 A1 * | 12/2014 | Inatomi | C23C 18/1619 427/315 |
| 2016/0013068 A1 * | 1/2016 | Butterbaugh | H01L 21/31111 438/748 |

FOREIGN PATENT DOCUMENTS

| | | |
|---|---|---|
| JP | 2003-001199 | 1/2003 |
| JP | 2004-006672 | 1/2004 |
| JP | 2007-227765 | 9/2007 |
| JP | 2008-047629 | 2/2008 |
| JP | 2008-091498 | 4/2008 |
| JP | 2010-103189 | 5/2010 |
| JP | 2010-103190 | 5/2010 |
| JP | 2011-066322 | 3/2011 |
| JP | 2011-086827 | 4/2011 |
| JP | 2012-003255 | 1/2012 |
| JP | 4950786 | 3/2012 |
| JP | 2012-084856 | 4/2012 |
| KR | 10-2012-0028212 | 12/2009 |
| KR | 10-2010-0112798 | 9/2010 |
| TW | 564474 | 10/1991 |

OTHER PUBLICATIONS

Office Action issued by Taiwanese Patent Office on Oct. 21, 2015 in connection with corresponding Taiwanese Application No. 102129036 and English and Japanese translations.

Office Action issued by Japanese Patent Office on Nov. 17, 2015 in connection with corresponding Japanese Application No. 2012-181540 and English translation thereof.

Jul. 26, 2016 Office Action issued for Japanese counterpart of this application, with English translation of same.

Decision of Grant issued on May 8, 2015 in corresponding Korean Patent Application No. 10-2013-0081020 (2 pages).

* cited by examiner

F I G . 7
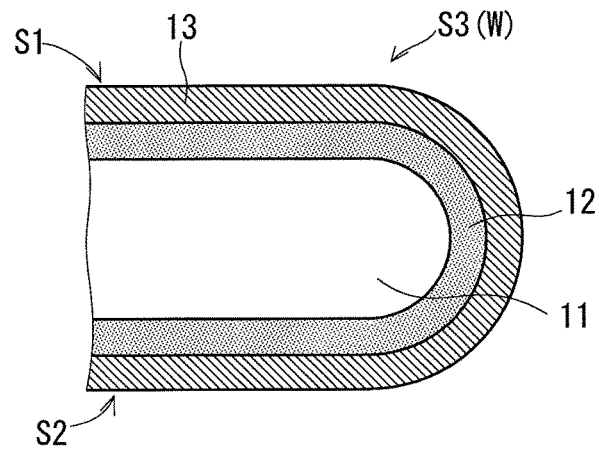
F I G . 8
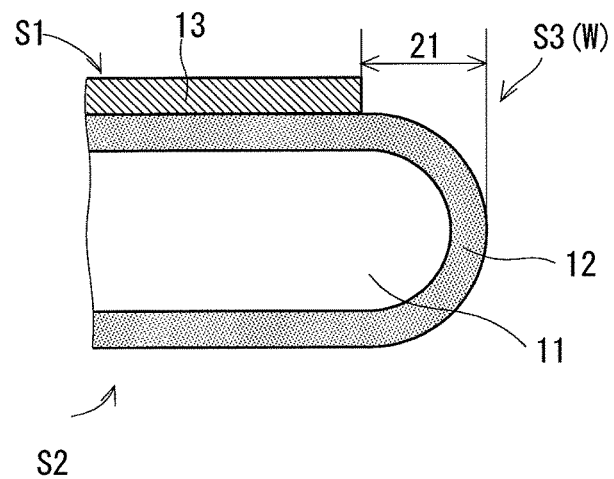
F I G . 9
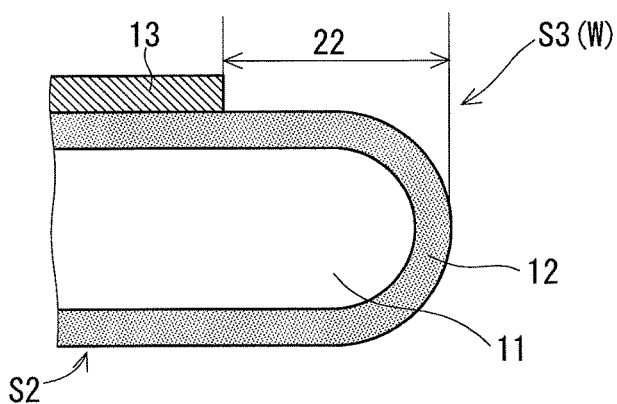

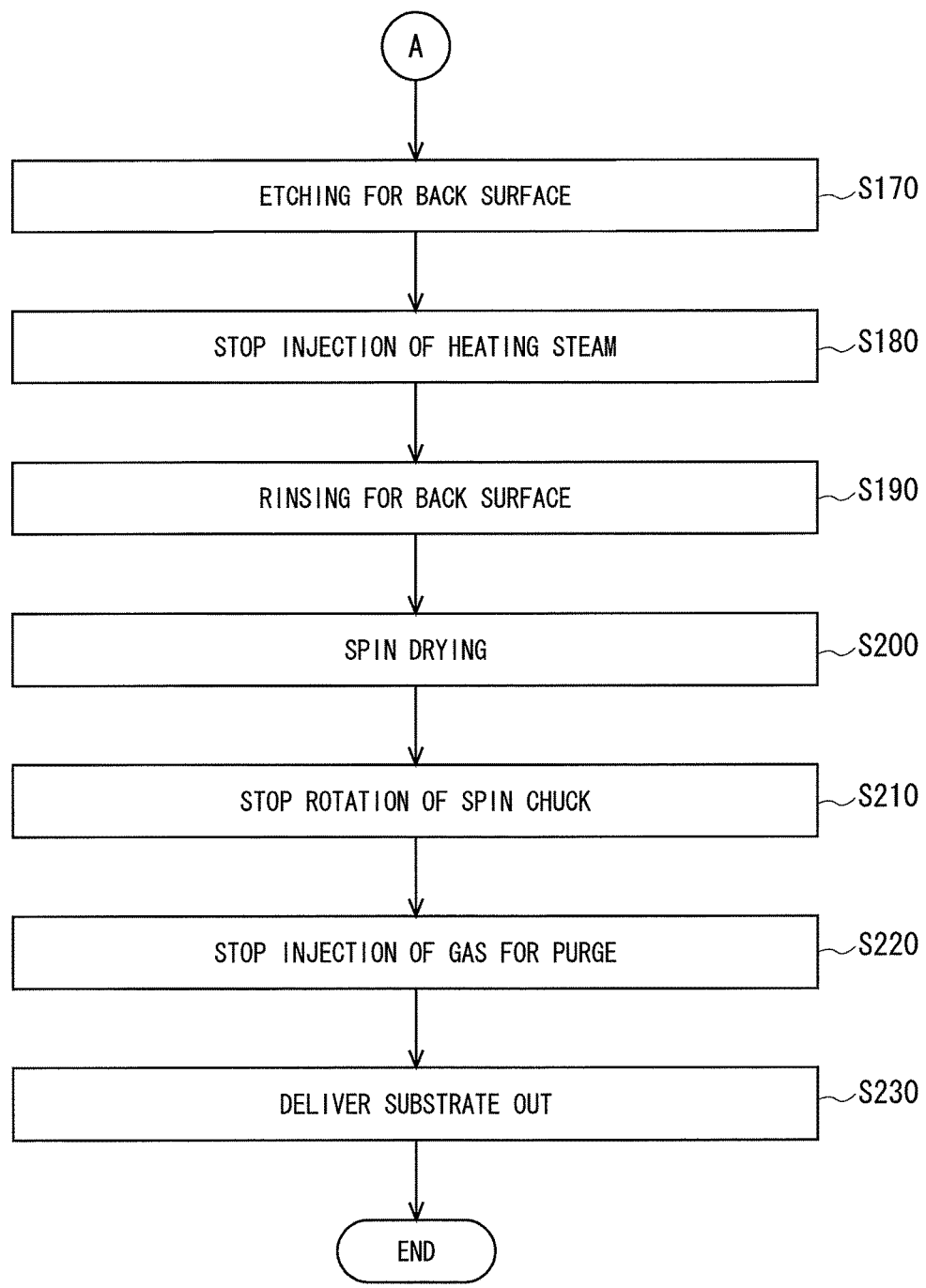

SUBSTRATE PROCESSING DEVICE AND SUBSTRATE PROCESSING METHOD FOR CARRYING OUT CHEMICAL TREATMENT FOR SUBSTRATE

CROSS REFERENCE TO RELATED APPLICATIONS

This is a divisional of U.S. patent application Ser. No. 13/953,964, filed Jul. 30, 2013 in the name of Nobuyuki SHIBAYAMA and entitled SUBSTRATE PROCESSING DEVICE AND SUBSTRATE PROCESSING METHOD FOR CARRYING OUT CHEMICAL TREATMENT FOR SUBSTRATE, which claims priority from Japanese Application No. JP2012-181540, filed Aug. 20, 2012.

BACKGROUND OF THE INVENTION

Field of the Invention

The present invention relates to a substrate processing device and a substrate processing method for supplying a processing liquid to a substrate to carry out a chemical treatment such as etching while rotating the substrate. The substrate to be processed includes substrates, for example, a semiconductor wafer, a substrate for an optical disk, a substrate for a magnetic disk, a substrate for a magneto-optical disk, a substrate for a photomask, a substrate for a solar cell, and the like.

Description of the Background Art

Although a series of processing steps for a substrate such as a semiconductor wafer have a plurality of film forming steps for forming a thin film of a metal, a photoresist or the like on a front surface ("an upper surface") of the substrate, a film is also formed on a back surface ("a lower surface") of the substrate or a peripheral edge part of the upper surface of the substrate at the film forming step in some cases. In general, however, the film formation is required for only a circuit formation region in a central part of the upper surface of the substrate in the substrate. In cases where the film is formed on the back surface of the substrate or the peripheral edge part of the upper surface of the substrate, a thin film formed on the peripheral edge part of the upper surface of the substrate may be peeled by contact with another device at a subsequent step to the film forming step, and may cause reduction in yield or a trouble of a substrate processing device itself.

Therefore, there is proposed a substrate processing device for carrying out so-called bevel etching, that is, supplying a processing liquid having its temperature previously controlled to a peripheral edge part of a substrate held in a substantially horizontal condition while rotating the substrate, thereby removing a thin film formed on the peripheral edge part of an upper surface of the substrate.

For example, the substrate processing device described in Japanese Patent Application Laid-Open No. 2004-6672 serves to supply the etchant from the nozzle taking an opposed shape to the central part in the lower surface of the substrate held in a substantially horizontal condition to the lower surface of the substrate while rotating the substrate, and to cause the etchant spreading toward the peripheral edge part by the action of centrifugal force to go around the peripheral edge part of the upper surface of the substrate, thereby etching the peripheral edge part of the upper surface of the substrate.

Moreover, the substrate processing device described in Japanese Patent Application Laid-Open No. 2008-47629 has the blocking member which is opposed to the upper surface of the substrate above the substrate and serves to supply the processing liquid from the nozzle disposed on the peripheral edge part of the blocking member toward the peripheral edge part of the upper surface of the substrate while rotating the substrate in the substantially horizontal plane, thereby etching the peripheral edge part of the upper surface of the substrate.

In the technique of this type, it is demanded to reduce an etching width in the peripheral edge part ("end") of the upper surface of the substrate as greatly and evenly as possible in order to effectively utilize, as a device, an area over the substrate which is as large as possible. In the technical field of manufacture of a semiconductor device, particularly, it is desired to decrease an etching width of 2 to 3 mm in the related art down to 1 mm or less in order to reduce a loss in a peripheral edge part of a wafer which is increased with increase in diameter of a semiconductor wafer, for example.

As a method for reducing the etching width by the substrate processing device described in the Japanese Patent Application Laid-Open No. 2004-6672, it is supposed to decrease an amount of supply of the processing liquid and to increase the rotating speed of the substrate in order to reduce an amount of wraparound of the processing liquid toward the upper surface of the substrate. According to the method, although an average etching width can be reduced, uniformity of the etching width is deteriorated, for example, the amount of wraparound of the processing liquid to the peripheral edge part is controlled with difficulty so that a portion to be etched locally and greatly appears. Furthermore, there is also a problem in that the temperatures of the peripheral edge part and the processing liquid in the peripheral edge part are lowered, resulting in reduction in an etching rate.

In order to decrease the etching width by the substrate processing device described in the Japanese Patent Application Laid-Open No. 2008-47629, it is necessary to decrease the amount of supply of the processing liquid to be supplied to the peripheral edge part of the substrate. However, there is a problem in that the etching rate in the peripheral edge part of the substrate is reduced due to decrease in the amount of the processing liquid and reduction in the temperature of the processing liquid in a pipe due to the decrease.

These are problems which are not limited to the etching using the etchant, but are caused in general processing for carrying out a chemical treatment for a substrate by using a processing liquid having a reaction rate increased with a rise in a temperature.

SUMMARY OF THE INVENTION

The present invention is directed to a substrate processing device for carrying out a chemical treatment for a substrate by using a processing liquid having a reaction rate increased with a rise in temperature.

According to the present invention, the substrate processing device includes a substrate holding portion for holding a substrate in a substantially horizontal posture; a rotating portion for rotating the substrate held in the substrate holding portion in a substantially horizontal plane; a heating portion for injecting heating steam into a central part of a lower surface of the substrate to entirely heat the substrate; and a peripheral edge processing portion for supplying a processing liquid from above to a peripheral edge part of the substrate which is heated by the heating portion, thereby carrying out a chemical treatment for the peripheral edge part.

The heating steam is injected to the central part of the lower surface of the substrate so that the substrate is entirely heated, and the processing liquid is supplied to the peripheral edge part from above so that even if an amount of the processing liquid to be supplied is small, it is possible to enhance reactivity of the processing liquid in the peripheral edge part by sufficiently heating the peripheral edge part. Accordingly, if the processing liquid is supplied from above to a desirable region having a small width at the substrate end side in the peripheral edge part, it is possible to reduce a chemical treating width while suppressing deterioration in each of uniformity of the chemical treating width (an etching width or the like) and chemical treating efficiency (an etching rate or the like). Moreover, the heating steam is injected to the lower surface of the substrate. Therefore, even if a water droplet is generated by condensation of the steam over the lower surface, it is possible to suppress wraparound of the water droplet onto an upper surface of the substrate. Accordingly, it is possible to prevent deterioration in a non-processed region from being caused by adhering of the water droplet or the like to the non-processed region on the upper surface of the substrate.

Preferably, the heating portion injects the steam to the lower surface of the substrate via a supply tube inserted into a rotating support shaft of the substrate holding portion.

Preferably, the steam is superheated steam.

Preferably, the peripheral edge processing portion regulates a width in a radial direction of the substrate in a portion in which the processing liquid collides with the peripheral edge part.

Moreover, the present invention is also directed to a substrate processing method for carrying out a chemical treatment for a substrate by using a processing liquid having a reaction rate increased with a rise in temperature.

Therefore, it is an object of the present invention to provide a technique capable of reducing a chemical treating width while suppressing deterioration in each of uniformity of a chemical treating width (an etching width or the like) and chemical treating efficiency (an etching rate or the like).

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a view showing an example of a sectional view of the substrate;

FIG. 8 is a view showing an example of the sectional view obtained after etching for the substrate of FIG. 7;

FIG. 9 is a view showing a comparative technique; and

FIGS. 10 and 11 are flow charts each illustrating an example of a flow of substrate processing according to the preferred embodiment.

DESCRIPTION OF THE PREFERRED EMBODIMENTS

Figure 1:
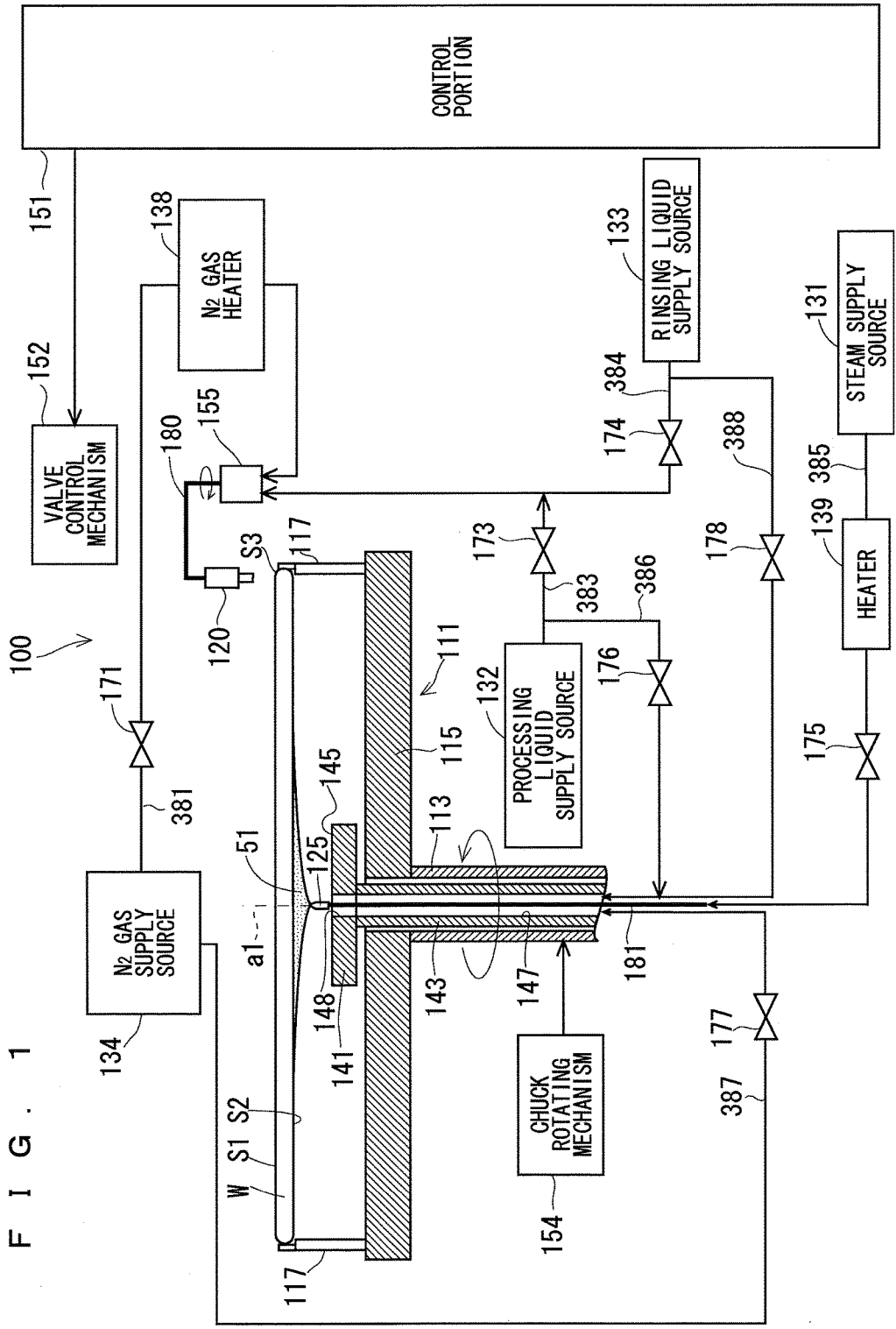
FIG. 1 is a view schematically showing an example of a schematic structure of a substrate processing device according to a preferred embodiment.

A preferred embodiment according to the present invention will be described below with reference to the drawings. Portions having the same structures and functions have the same reference numerals in the drawings, and repetitive description will be omitted in the following explanation. Moreover, each of the drawings is shown schematically, and for example, a size, a positional relationship and the like of an illustrated member in the drawing are not always shown accurately.

Preferred Embodiment

<1. Structure of Substrate Processing Device>

FIG. 1 is a view schematically showing an example of a schematic structure of a substrate processing device 100 according to a preferred embodiment. The substrate processing device 100 carries out a chemical treatment for a substrate by using a processing liquid having a reaction rate increased with a rise in temperature. More specifically, the substrate processing device 100 performs etching for a peripheral edge part (also referred to as an "upper surface peripheral edge part") S3 of a substrate W such as a semiconductor wafer in a front surface(also referred to as an "upper surface") S1 of the substrate W by using an etchant as a processing liquid for a chemical treatment, thereby removing a thin film (an unnecessary object) formed on the upper surface peripheral edge part S3. The upper surface peripheral edge part S3 is a ring-shaped region having a width of 0.5 to 3.0 mm from a peripheral edge of the substrate W in the upper surface S1 of the substrate W, for example. A back surface S2 at a side opposite to the upper surface S1 is also referred to as a "lower surface". An upper surface shape of the substrate W is substantially circular, and the upper surface S1 of the substrate W implies a device formation surface on which a device pattern is to be formed.

In addition to the etchant to be used in the etching, most of chemical treating solutions conform to the general Arrhenius equation in which a reaction rate is increased with a rise in temperature. In other words, most of treating solutions belong to "a processing liquid having a reaction rate increased with a rise in temperature".

FIG. 7 is a view showing an example of a sectional view of the substrate W. As shown in FIG. 7, a central layer 11 of the substrate W is constituted by silicon (Si). An insulating film which does not conduct electricity, for example, a thermal oxide film ($Th-SiO_2$), Hf (hafnium), Hf oxide, or the like is formed on the central layer 11 as a lower film 12. Then, a barrier metal film such as a TiN film or a TaN film, or a metal film such as an Al film, a W film, a NiSi film, or a Cu film is formed on the lower film 12 as an upper film 13. In the substrate W, the upper film 13 in a region (a processed region) at a peripheral edge side in the upper surface peripheral edge part S3 is removed by etching. For example, a substrate having only the lower film 12 formed on the central layer 11 may be employed as the substrate W, and the lower film 12 in the processed region of the upper surface peripheral edge part may be removed.

As shown in FIG. 1, the substrate processing device 100 includes a spin chuck ("a substrate holding portion") 111 for holding and rotating the substrate W in a substantially horizontal posture with the upper surface S1 facing upward. The spin chuck 111 has a cylindrical rotating support shaft 113 coupled to a rotating axis of a chuck rotating mechanism ("a rotating portion") 154 including a motor, and is rotatable around a rotating axis a1 (a vertical axis), that is, in a substantially horizontal plane by a driving operation of the chuck rotating mechanism 154.

A disk-shaped spin base 115 is integrally coupled to an upper end of the rotating support shaft 113 by means of a fastening component such as a screw. Accordingly, the chuck rotating mechanism 154 is operated in response to an operation command sent from a control portion 151 for controlling the entire device so that the spin base 115 is rotated around the rotating axis a1. Moreover, the control portion 151 controls the chuck rotating mechanism 154 to regulate a rotating speed. The control portion 151 is implemented through execution of a program stored in a memory by a CPU or the like, for example.

A plurality of chuck pins 117 for gripping the peripheral edge part of the substrate W is erected in the vicinity of the peripheral edge part of the spin base 115. It is sufficient that at least three chuck pins 117 are provided in order to reliably hold the circular substrate W, and the chuck pins 117 are disposed at an equal angle interval along the peripheral edge part of the spin base 115. Each of the chuck pins 117 includes a substrate supporting portion for supporting the peripheral edge part of the substrate W from below and a substrate holding portion for pressing an outer peripheral end face of the substrate W supported on the substrate supporting portion to hold the substrate W. Each of the chuck pins 117 is configured to be switchable between a pressing state in which the substrate holding portion presses the outer peripheral end face of the substrate W and a releasing state in which the substrate holding portion is released from the outer peripheral end face of the substrate W.

The plurality of chuck pins 117 are brought into the releasing state when the substrate W is transferred to the spin base 115, and the plurality of chuck pins 117 are brought into the pressing state when etching is carried out over the substrate W. By setting the pressing state, the plurality of chuck pins 117 can grip the peripheral edge part of the substrate W, thereby holding the substrate W in a substantially horizontal posture at a predetermined interval from the spin base 115. Consequently, the substrate W is supported with the upper surface (pattern formation surface) S1 facing upward and the back surface S2 facing downward.

The spin chuck 111 thus holding the substrate W is rotationally driven by the chuck rotating mechanism 154 to rotate the substrate W at a predetermined rotating speed, and at the same time, a processing liquid is supplied to the upper surface peripheral edge part S3 of the upper surface S1 and the back surface S2 in the substrate W through a nozzle unit 120 and a lower nozzle 141, respectively. Consequently, a predetermined chemical treatment (etching) is performed.

Figure 2:
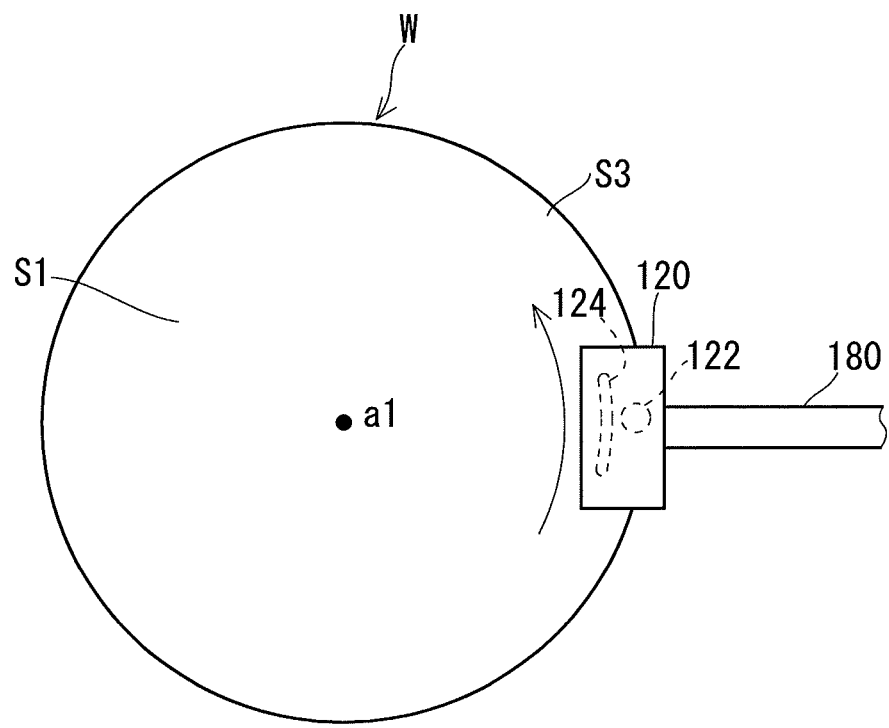
FIG. 2 is a top view schematically showing an arrangement of a nozzle unit with respect to an upper surface of a substrate.
Figure 3:
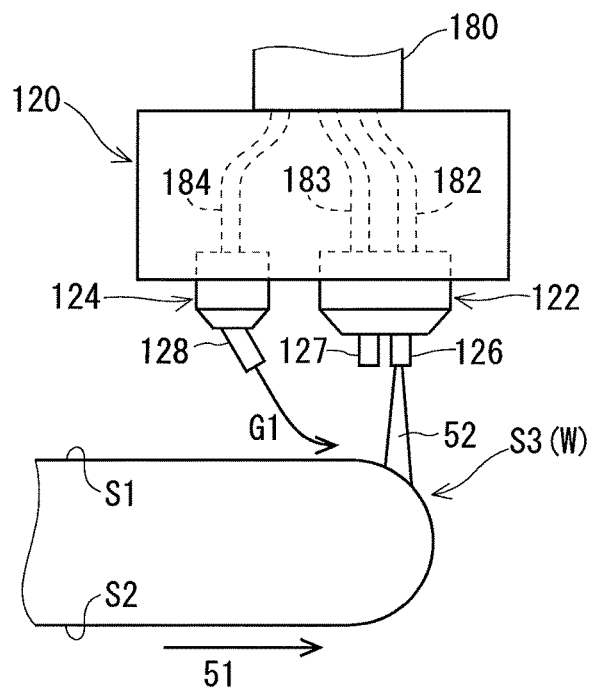
FIGS. 3 and 4 are side views each illustrating an example of a structure of the nozzle unit.
Figure 4:
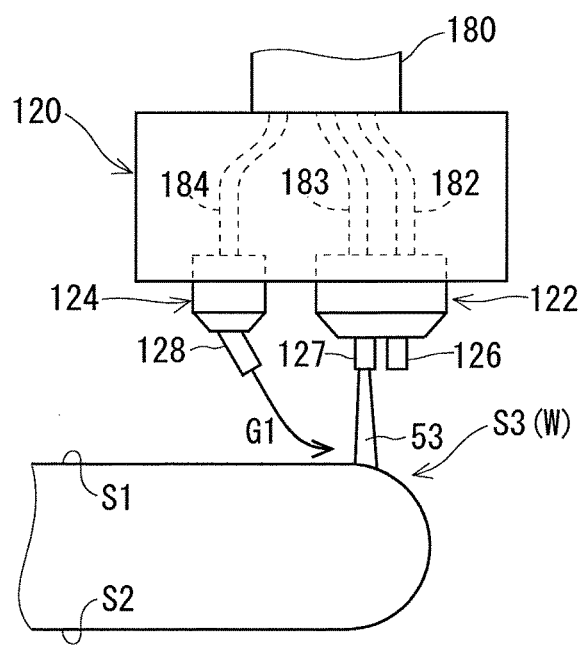

FIG. 2 is a top view schematically showing the arrangement of the nozzle unit 120 with respect to the upper surface S1 of the substrate W. For convenience of illustration, a size of the nozzle unit 120 is set to be larger than an actual size with respect to the substrate W. FIGS. 3 and 4 are side views each showing an example of a structure of the nozzle unit 120.

A nozzle rotating mechanism 155 including a motor is provided on the side of the substrate W held on the spin chuck 111 as shown in FIGS. 1 and 2, and an operation of the nozzle rotating mechanism 155 is controlled by the control portion 151. A rigid tubular piping arm 180 is attached to the nozzle rotating mechanism 155 pivotably in a substantially horizontal plane with the nozzle rotating mechanism 155 set to be a rotating center.

One of ends of the piping arm 180 penetrates the nozzle rotating mechanism 155 to reach a lower surface thereof, and the other end can be positioned above the upper surface peripheral edge part S3 of the substrate W by swinging of the piping arm 180 by the nozzle rotating mechanism 155. The nozzle unit 120 is attached to the other end. In the transfer of the substrate W to the spin base 115 or the like, the piping arm 180 is swung so that the nozzle unit 120 is moved backward from a delivery-in path for the substrate W. Moreover, a position (a processing position) of the nozzle unit 120 in execution of etching, rinsing, or the like is accurately adjusted by servo control so that the etching width of the upper surface peripheral edge part S3 is regulated. The servo control is carried out by the control portion 151. Therefore, it is possible to regulate the etching width of the upper surface peripheral edge part S3 in accordance with a command sent from the control portion 151.

As shown in FIGS. 2 to 4, the nozzle unit 120 is configured to include a processing liquid discharging portion ("a peripheral edge processing portion") 122 having a processing liquid supply nozzle 126 and a rinsing liquid supply nozzle 127, and a nitrogen gas injecting portion 124 having a nitrogen gas injection nozzle 128. Pipes 182 to 184 are connected to the processing liquid supply nozzle 126, the rinsing liquid supply nozzle 127, and the nitrogen gas injection nozzle 128, respectively. The pipes 182 to 184 are disposed to pass through an inner part of the piping arm 180 via an inner part of the nozzle unit 120 and to reach a portion provided below the lower surface of the nozzle rotating mechanism 155, respectively.

As shown in FIG. 1, furthermore, the substrate processing device 100 is also provided with a processing liquid supply source 132 for supplying an etchant (a processing liquid) which is stored therein and a rinsing liquid supply source 133 for supplying a rinsing liquid which is stored therein. For example, SC1 (ammonia-hydrogen peroxide mixture), SC2 (hydrochloric acid/hydrogen peroxide mixture), HF (hydrofluoric acid) or the like is employed for the etchant. Note that contamination is caused if a metal component such as Mo or Co adheres onto a contact part with a wafer in another manufacturing apparatus or a delivery system, an inside of FOUP/FOSB holding a wafer or the like. For this reason, the SC2 is used for washing a bevel portion or a back surface of the wafer in order to remove the adhering metal component, for example. Thus, in some cases, the processing liquid stored in the processing liquid supply source 132 is supplied to the wafer for the purpose other than etching.

Pure water (DIW: deionized water) or the like is employed for the rinsing liquid to be supplied by the rinsing liquid supply source 133. Functional water or warm water may be employed for the rinsing liquid.

The pipe 182 connected to the processing liquid supply nozzle 126 of the processing liquid discharging portion 122 is connected in communication with a pipe 383 provided out of the processing liquid supply source 132, and an on-off valve 173 is provided in a middle part of the pipe 383. The pipe 183 connected to the rinsing liquid supply nozzle 127 of the processing liquid discharging portion 122 is connected in communication with a pipe 384 provided out of the rinsing liquid supply source 133. An on-off valve 174 is provided in a middle part of the pipe 384.

The on-off valves 173 and 174 are on-off controlled by means of a valve control mechanism 152 which is controlled by the control portion 151, and the valve control mechanism 152 selectively opens the on-off valve 173 and the on-off valve 174 as necessary.

If the on-off valve 173 is opened, a processing liquid 52 (FIG. 3) supplied from the processing liquid supply source 132 is discharged from the processing liquid supply nozzle 126 of the processing liquid discharging portion 122 and is thus supplied to the upper surface peripheral edge part S3. The processing liquid discharging portion 122 supplies the processing liquid 52 from above to the peripheral edge part of the substrate W heated by the lower nozzle 141 which will be described below, thereby carrying out a chemical treatment (etching) for the peripheral edge part. A flow rate of the processing liquid to be supplied to the upper surface peripheral edge part S3 is set to be small, for example, approximately 10 ml to 100 ml per minute. As described above, moreover, the rotating angle of the piping arm 180 connected to the nozzle unit 120 is accurately regulated by the nozzle rotating mechanism 155. Consequently, the processing liquid discharging portion 122 can precisely regulate a width in a radial direction of the substrate W in a portion in which the processing liquid to be discharged collides with the upper surface peripheral edge part S3 of the substrate W.

In the case where an etchant (a processing liquid) having a reaction rate increased with a rise in temperature is used, it is possible to reduce an etching width (a chemical treating width) by supplying the processing liquid to a desirable region having a small width at the peripheral edge side of the upper surface peripheral edge part S3 of the substrate W having the entire upper surface S1 heated. More specifically, the etching width can be reduced to be approximately 0.5 mm to 1 mm, for example.

Furthermore, it is preferable that the processing liquid discharging portion 122 supply the processing liquid to the upper surface peripheral edge part S3 of the substrate W along a path in an obliquely downward direction from an inside of the substrate W toward an outside thereof. Consequently, the supplied processing liquid can be prevented from adhering onto a non-processed region of the substrate W.

In addition, if the on-off valve 174 is opened, a rinsing liquid 53 (FIG. 4) supplied from the rinsing liquid supply source 133 is discharged from the rinsing liquid supply nozzle 127 of the processing liquid discharging portion 122 and is thus supplied to the upper surface peripheral edge part S3. Consequently, rinsing for the peripheral edge part of the substrate W is carried out.

As shown in FIG. 1, a through hole connected to a through hole of the rotating support shaft 113 is formed on a central part of the spin base 115. A cylindrical portion 143 is inserted into these through holes. The substantially disk-shaped lower nozzle 141 is fixed to an upper end of the cylindrical portion 143. A diameter of the lower nozzle 141 is set to be smaller than a diameter of a rotating track of the chuck pin 117 in such a manner that the chuck pin 117 erected on the rotating spin base 115 does not interfere with the lower nozzle 141.

The processing liquid is supplied from the processing liquid supply source 132 through a pipe 386 to a supply tube 147 connected to a processing liquid discharging port 148 of the lower nozzle 141, and furthermore, a rinsing liquid is supplied thereto from the rinsing liquid supply source 133 through a pipe 388. On-off valves 176 and 178 are provided in the middle parts of the pipes 386 and 388, respectively. The on-off valves 176 and 178 are on-off controlled by means of the valve control mechanism 152. The valve control mechanism 152 selectively opens the on-off valve 176 and the on-off valve 178 so that the processing liquid and the rinsing liquid are selectively supplied to the supply tube 147 and are selectively discharged from the processing liquid discharging port 148 on an upper surface 145 of the lower nozzle 141 toward the back surface S2 of the substrate W. The processing liquid and the rinsing liquid which are discharged spread over the entire region of the back surface S2 by the action of centrifugal force generated by the rotation of the substrate W. Consequently, the lower nozzle 141 performs the etching and rinsing for the back surface S2.

Moreover, the processing liquid discharging port 148 is formed on the lower nozzle 141. The processing liquid discharging port 148 has an opening on the central part of the upper surface 145 and penetrates the lower nozzle 141. The processing liquid discharging port 148 is connected in communication with the supply tube 147 to be a through hole formed by an internal wall of the cylindrical portion 143.

Furthermore, a supply tube 181 penetrating the supply tube 147 and the processing liquid discharging port 148 is inserted into the supply tube 147 and the processing liquid discharging port 148. In other words, the supply tube 181 is inserted through the inner part of the rotating support shaft 113 which supports the spin base 115 and is rotated integrally with the spin base 115. At an upper end of the supply tube 181 protruded to the upper surface 145 of the lower nozzle 141, a steam injection nozzle 125 (also referred to as a "heating portion") is connected in communication with the supply tube 181. Moreover, a lower end of the supply tube 181 is connected to a steam supply source 131 at an outside of the substrate processing device 100 by means of a pipe 385. Heating steam 51 to be supplied from the steam supply source 131 is fed to the steam injection nozzle 125 via the pipe 385 and the supply tube 181. Then, the steam injection nozzle 125 injects the supplied heating steam 51 into the central part of the back surface S2 of the substrate W, thereby entirely heating the substrate W.

A heater 139 and an on-off valve 175 are provided in a middle part of the pipe 385 connecting the steam supply source 131 and the supply tube 181 in the substrate processing device 100.

The heater 139 heats steam supplied from the steam supply source 131 depending on the control of the control portion 151. In the steam supply source 131, pure water or the like is heated so that steam for entirely heating the substrate W is generated. The heating steam thus generated is heated by the heater 139 and is then supplied as superheated steam having a higher temperature than 100° C., for example.

The on-off valve 175 is on-off controlled by the valve control mechanism 152 which is controlled by means of the control portion 151. The valve control mechanism 152 opens the on-off valve 175 as necessary so that heating steam 51 supplied from the steam supply source 131 is injected from the supply tube 181 of the lower nozzle 141 to the central part of the back surface S2 of the substrate W.

The steam 51 injected from the steam injection nozzle 125 to the central part of the back surface S2 is rotated in a reverse rotating direction to a rotating direction of the substrate W relatively with the back surface S2 of the substrate W, and at the same time, spreads toward the peripheral edge part of the back surface S2 by centrifugal force and a supply pressure which are generated by the rotation of the substrate W. Consequently, the entire region of the back surface S2 is heated, and furthermore, the entire region of the upper surface S1 is also heated by thermal conduction from the back surface S2 to the upper surface S1.

The steam 51 injected to the central part of the back surface S2 is cooled by taking heat through the substrate W in a process of spreading toward the peripheral edge part of the back surface S2. For this reason, the steam 51 is condensed over the back surface S2 so that a water droplet is generated in some cases. The water droplet thus generated is shaken off from the peripheral edge part of the back surface S2 to the outside of the substrate W by the action of centrifugal force through high-speed rotation of the substrate W and does not adhere onto the non-processed region of the upper surface S1.

The superheated steam at 110° C. is supplied from the steam supply source 131 to the heater 139, for example, and a temperature of the superheated steam obtained immediately after heating by the heater 139 is preferably set to be 140° C. to 160° C. or the like, for example. The superheated steam having a high temperature is injected to the central part of the back surface S2 of the rotated substrate W to heat the substrate W, and at the same time, can also be maintained at a high temperature after reaching the peripheral edge part along the back surface S2. Accordingly, the water droplet obtained by the condensation of the steam 51 or the like can be further prevented from adhering onto the non-processed region of the upper surface S1 of the substrate W. Moreover, if the superheated steam having the high temperature is used, it is possible to cause the upper surface peripheral edge part S3 of the substrate W to have a higher temperature, thereby increasing an etching rate more greatly as compared with the case where saturated steam having a temperature of 100° C. or less is discharged from the lower nozzle 141, for example.

Figure 5:
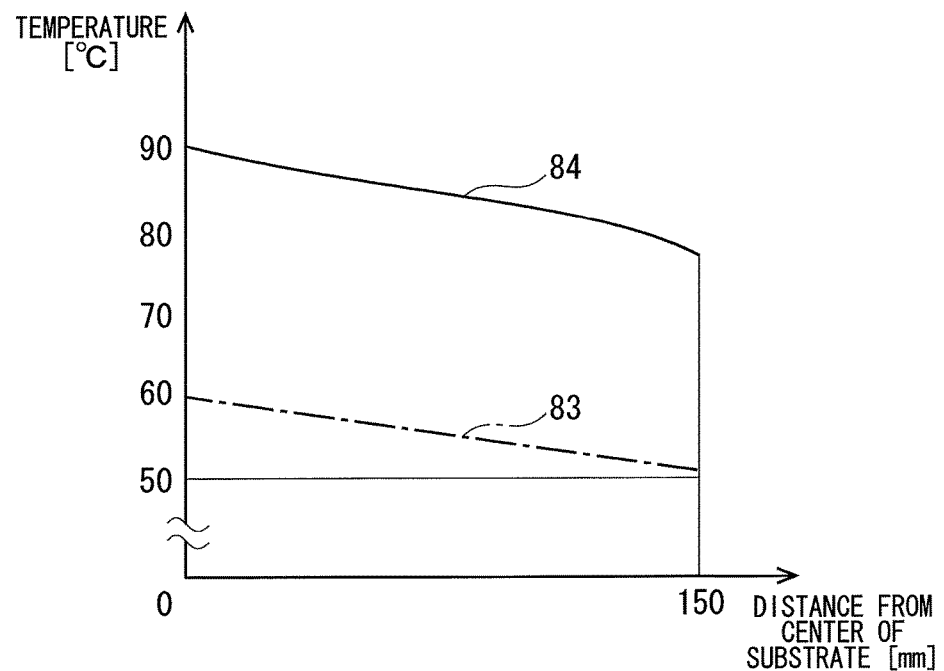
FIG. 5 is a view illustrating, in a graph, a difference in temperature distribution over the substrate depending on presence or absence of a steam injection nozzle.

FIG. 5 is a view illustrating, in a graph, a difference in temperature distribution on the substrate W depending on presence or absence of the steam injection nozzle 125 for heating the back surface S2 of the substrate W. A graph 83 shows an example of a temperature distribution on the upper surface S1 of the substrate W in the case where the processing liquid is discharged from the lower nozzle 141 provided on the back surface S2 side of the substrate W toward the back surface S2 of the substrate W which is being rotated at a predetermined rotating speed. The back surface S2 is not heated by the steam injection nozzle 125. The processing liquid to be discharged to the back surface S2 has a temperature regulated to 70° C. or the like, for example, and is supplied to the peripheral edge part of the substrate W by the action of centrifugal force. The upper surface S1 is heated with the processing liquid supplied to the back surface S2. Moreover, a graph 84 shows an example of a temperature distribution on the upper surface S1 of the substrate W in the case where the heating steam is injected from the steam injection nozzle 125 onto the back surface S2.

As shown in each of the graphs in FIG. 5, the temperature of the processing liquid or the steam is gradually reduced depending on the rotation of the substrate W apart from the central part of the substrate W so that the temperature on the upper surface S1 is also reduced. However, in the case where the back surface S2 of the substrate W is heated by the steam injection nozzle 125, it is possible to increase a temperature in the upper surface peripheral edge part S3 portion as compared with the case where the heating is not carried out by the steam injection nozzle 125 as shown in the graph 84. Moreover, in the case where etching is carried out over the back surface S2, it is possible to carry out processing with the substrate W having a high temperature (that is, a high etching rate) by supplying the processing liquid and the steam at the same time.

Figure 6:
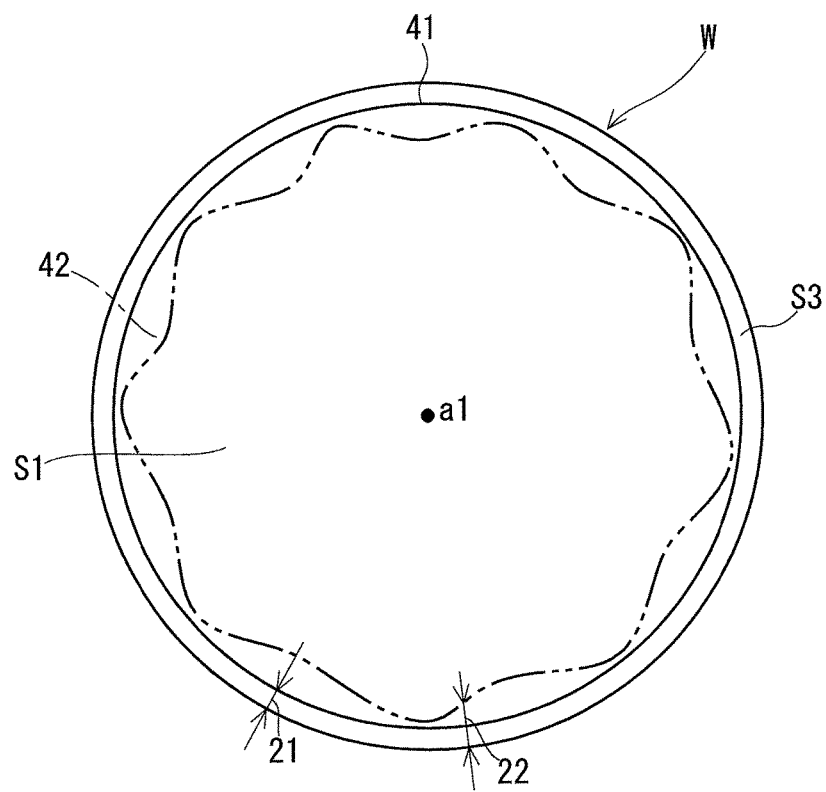
FIG. 6 is a view illustrating a difference in etching width over the substrate depending on the presence or absence of the steam injection nozzle.

FIG. 6 is a view showing a difference in an etching width over the upper surface S1 of the substrate W illustrated in FIG. 7 depending on presence or absence of an operation for supplying the heating steam through the steam injection nozzle 125. For convenience of illustration, each etching width is described to be larger than an actual width.

A substantially circular boundary 41 indicates an example of a boundary between an etched region and a non-processed region which is not subjected to the etching at the rotating axis a1 side in the case where the back surface S2 is heated by the steam injection nozzle 125, and at the same time, the processing liquid is supplied from the processing liquid supply nozzle 126 to the upper surface peripheral edge part S3. Moreover, FIG. 8 is a view showing an example of a sectional view of the substrate W obtained after the etching in this case. A width 21 (FIGS. 6 and 8) indicates an etching width at one point on the boundary 41. The etching width 21 is approximately 0.5 to 1.0 mm, for example, and a variation thereof is reduced to be approximately ⅒ or less of a mean value of the etching width 21, for example.

A boundary 42 indicates an example of a boundary between an etched region in the upper surface S1 of the substrate W and a non-processed region in the case where the etching for the upper surface peripheral edge part S3 is carried out with the processing liquid discharged from the lower nozzle 141 provided on the back surface S2 side of the substrate W to the back surface S2 of the rotating substrate W. FIG. 9 is a view showing an example of the sectional view of the substrate W obtained after the etching in this case. The centrifugal force acts on the processing liquid discharged to the back surface S2 so that the processing liquid spreads toward the peripheral edge part of the substrate W, and furthermore, goes around the upper surface peripheral edge part S3. Thus, the upper surface peripheral edge part S3 is etched. The rotating speed of the substrate W is regulated in such a manner that the processing liquid can go around the upper surface peripheral edge part S3 from the back surface S2. There are carried out neither the heating for the back surface S2 through the steam injection nozzle 125 nor the supply of the processing liquid to the upper surface peripheral edge part S3 through the processing liquid discharging portion 122.

A width 22 indicates an etching width at one point on the boundary 42. It is difficult to control an amount of the processing liquid going around the upper surface peripheral edge part S3 by the action of the centrifugal force. For this reason, a shape of the boundary 42 is more wavy than the boundary 41 taking the substantially circular shape, and the etching width 22 is approximately 2 to 3 mm, for example, and is larger than the etching width 21. Moreover, a variation in the etching width 22 is greater than that in the etching width 21.

As shown in FIGS. 6, 8 and 9, in the case where there are carried out the heating for the back surface S2 of the substrate W through the steam injection nozzle 125 and the supply of the processing liquid to a region having a small width at the peripheral edge side of the upper surface peripheral edge part S3 through the processing liquid discharging portion 122, the etching width in the upper surface peripheral edge part S3 is smaller and the variation in the etching width is also reduced as compared with the case where the etching is carried out by the wraparound of the processing liquid from the back surface S2 side.

Returning to FIG. 1, a nitrogen gas supply source 134 is provided on the outside of the substrate processing device 100. As shown in FIGS. 3 and 4, a nitrogen gas is supplied from the nitrogen gas supply source 134 through a pipe 381 to the pipe 184 connected to the nitrogen gas injecting portion 124 in the substrate processing device 100. An on-off valve 171 to be on-off controlled by the valve control mechanism 152 is provided in a middle part of the pipe 381 in the substrate processing device 100.

When the control portion 151 opens the on-off valve 171 through the valve control mechanism 152, the nitrogen gas is supplied from the nitrogen gas supply source 134 to the nitrogen gas injecting portion 124.

The nitrogen gas injecting portion 124 is configured to have a slender arcuate sectional shape in a circumferential direction of the substrate W, for example. The nitrogen gas injection nozzle 128 is configured by an injection nozzle having a slender arc-shaped opening in the circumferential direction of the substrate W on a lower surface of the nitrogen gas injecting portion 124, a plurality of cylindrical injection nozzles provided at a predetermined interval on the lower surface of the nitrogen gas injecting portion 124 or the like. The nitrogen gas supplied to the nitrogen gas injecting portion 124 is injected as a nitrogen gas G1 (a gas for purge) from the nitrogen gas injection nozzle 128 to the upper surface S1 of the rotating substrate W.

In more detail, the nitrogen gas G1 is injected from the nitrogen gas injection nozzle 128 provided above the substrate W toward a predetermined injection target region defined within a range surrounded by the rotating track of the upper surface peripheral edge part S3 in the upper surface S1 of the substrate W. The nitrogen gas G1 injected onto the upper surface S1 forms a gas flow which flows from the injection target region toward the upper surface peripheral edge part S3 of the substrate W. With the air flow formed by the nitrogen gas G1, mist obtained by the condensation of the steam 51 injected from the steam injection nozzle 125 to the back surface S2 and the processing liquid 52 discharged from the processing liquid supply nozzle 126 of the processing liquid discharging portion 122 or the like can be prevented from adhering onto the non-processed region in the upper surface S1 of the substrate W where the etching is not carried out.

Moreover, also in a drying treatment for the upper surface S1 of the substrate W after the end of the rinsing, the substrate W is promoted to be dried with the nitrogen gas G1 supplied from the nitrogen gas injection nozzle 128, and furthermore, the rinsing liquid shaken off from the upper surface peripheral edge part S3 toward the outside of the substrate W by the centrifugal force acting through the high-speed rotation of the substrate W can be prevented from returning to the substrate W and adhering onto the non-processed region of the upper surface S1.

Furthermore, as shown in FIG. 1, the nitrogen gas is supplied from the nitrogen gas supply source 134 through a pipe 387 to the supply tube 147 connected to the lower nozzle 141. An on-off valve 177 to be on-off controlled by the valve control mechanism 152 is provided in a middle part of the pipe 387. The control portion 151 opens the on-off valve 177 through the valve control mechanism 152 after the end of the rinsing for the back surface S2 so that the nitrogen gas is supplied from the processing liquid discharging port 148 of the lower nozzle 141 to the back surface S2 of the rotating substrate W.

Great centrifugal force acts on the rinsing liquid adhering to the back surface S2 by the high-speed rotation of the substrate W so that the rinsing liquid is shaken off around the substrate W and the drying treatment for the back surface S2 is carried out. Moreover, drying of the back surface S2 is also promoted with the nitrogen gas supplied from the lower nozzle 141 to the back surface S2.

Even if the substrate processing device 100 includes neither the nitrogen gas supply source 134 nor the nitrogen gas injecting portion 124, it is possible to reduce the etching width while suppressing deterioration in each of the uniformity of the etching width and the etching rate. Therefore, the usefulness of the present invention is not lost.

<2. Operation of Substrate Processing Device>

Figure 10:
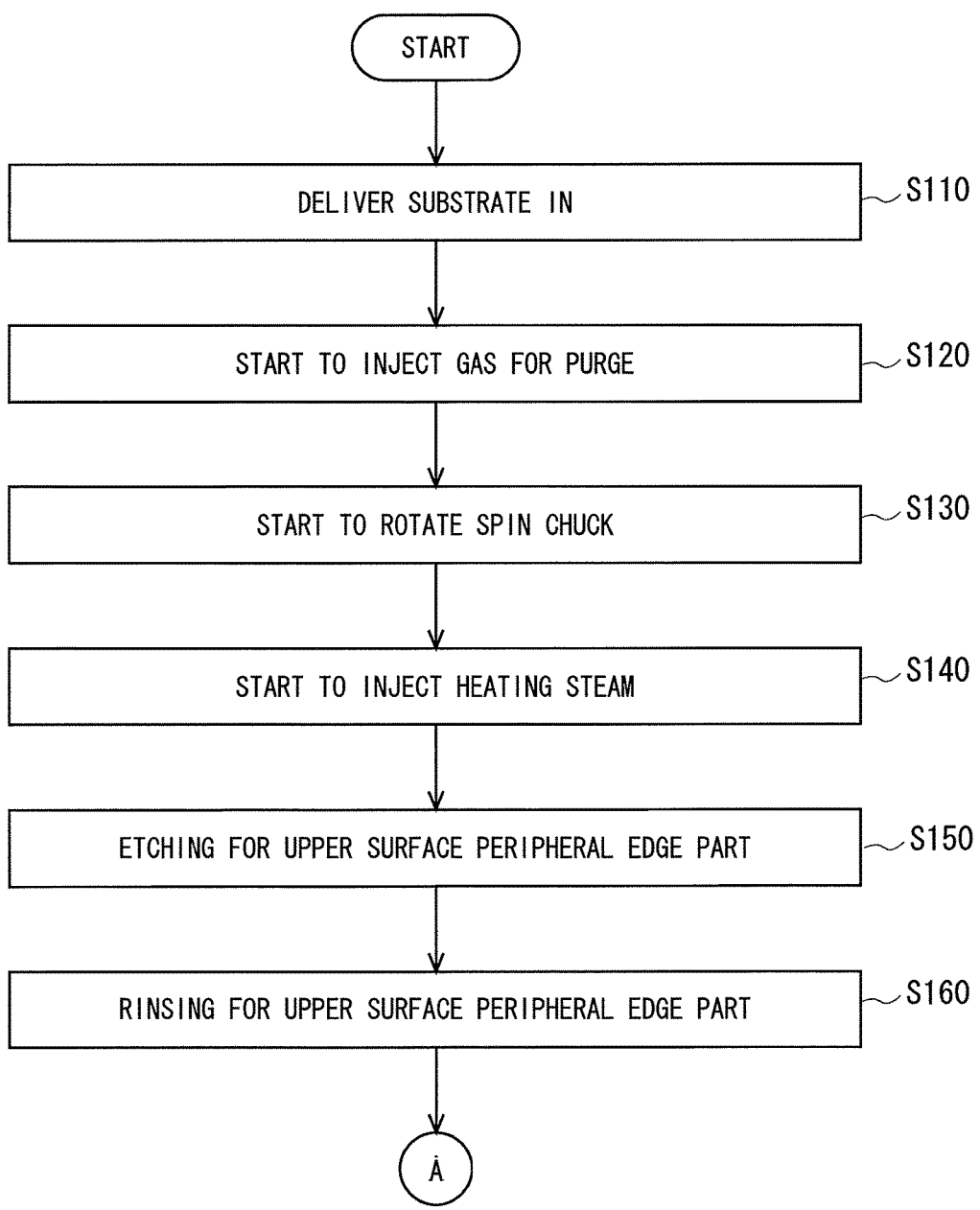

FIGS. 10 and 11 are flow charts showing an example of a flow of substrate processing to be carried out by the substrate processing device 100 according to the preferred embodiment. Before the start of the processing, each of the on-off valves is closed and the spin chuck 111 is stationary. Moreover, the nozzle unit 120 is placed in a standby position other than the delivery-in path for the substrate W. First of all, a single substrate W is delivered by a substrate delivery robot (not shown) into a processing chamber (chamber) (not shown) in which the spin chuck 111 is disposed, and is mounted on the spin chuck 111 to be held by the chuck pin 117 (step S110).

Subsequently, the nozzle unit 120 is placed in a predetermined position above the upper surface peripheral edge part S3 of the substrate W. Then, the on-off valve 171 is opened and the nitrogen gas is started to be supplied from the nitrogen gas supply source 134 in a flow rate of 30 L to 100 L per minute, for example. The nitrogen gas is heated to 120° C. to 150° C. by a nitrogen gas heater 138, for example, and is then injected as the nitrogen gas G1 (a gas for purge) from the nitrogen gas injecting portion 124 toward the upper surface peripheral edge part S3 of the substrate W (step S120). In the case where the nitrogen gas having an ordinary temperature that is supplied from the nitrogen gas supply source 134 is not heated but injected as the gas for purge from the nitrogen gas injecting portion 124, the temperature is reduced in the substrate W so that the etching rate is decreased. However, if the nitrogen gas heated by the nitrogen gas heater 138 is supplied as the gas for purge to the upper surface peripheral edge part S3 of the substrate W, the etching rate can be prevented from being decreased.

Next, the control portion 151 controls the chuck rotating mechanism 154 so that the rotation of the spin chuck 111 is started in such a manner that the rotating speed of the spin chuck 111 becomes a predetermined high rotating speed of 50 rpm to 1000 rpm, for example (step S130). Then, the on-off valve 175 is opened so that the heating steam generated by the steam supply source 131 and heated by the heater 139 is supplied to the steam injection nozzle 125 via the supply tube 181. Thereafter, the steam injection nozzle 125 starts to inject the heating steam toward the central part of the back surface S2 of the substrate W (step S140), thereby starting to entirely heat the substrate W through thermal conduction from the central part of the back surface S2.

Subsequently, the etching for the upper surface peripheral edge part S3 of the substrate W is carried out (step S150). More specifically, the on-off valve 173 is opened so that the processing liquid is supplied from the processing liquid supply source 132 to the processing liquid discharging portion 122 of the nozzle unit 120 and discharged from the processing liquid supply nozzle 126 to a narrow width region at the peripheral edge side of the upper surface peripheral edge part S3 which is heated. Then, the etching for the upper surface peripheral edge part S3 of the substrate W is carried out with the processing liquid thus discharged.

When a predetermined time elapsed and the etching for the upper surface peripheral edge part S3 is completed, the on-off valve 175 is closed so that the supply of the processing liquid to the substrate W is stopped.

Subsequently, the rinsing for the upper surface peripheral edge part S3 of the substrate W is carried out (step S160). More specifically, the on-off valve 174 is opened and the rinsing liquid is started to be supplied from the rinsing liquid supply source 133. Then, the rinsing liquid is discharged from the rinsing liquid supply nozzle 127 of the processing liquid discharging portion 122 to the upper surface peripheral edge part S3 so that the rinsing for the upper surface peripheral edge part S3 is carried out. When a predetermined time elapsed and the rinsing for the upper surface peripheral edge part S3 is completed, the on-off valve 174 is closed so that the supply of the rinsing liquid is stopped.

Next, the etching for the back surface S2 of the substrate W is carried out (step S170). More specifically, the on-off valve 176 is opened so that the processing liquid is supplied from the processing liquid supply source 132 to the lower nozzle 141 and discharged to the heated back surface S2. Thereafter, the etching for the back surface S2 of the substrate W is carried out with the discharged processing liquid. In the etching for the back surface S2, it is preferable that pure water or DIW should be supplied from above to the upper surface peripheral edge part S3 through the rinsing liquid supply nozzle 127, thereby preventing the processing liquid from going around the upper surface peripheral edge part S3 from the back surface S2.

When a predetermined time elapsed and the etching for the back surface S2 is completed, the on-off valve 176 is closed so that the supply of the processing liquid to the back surface S2 is stopped. Then, the on-off valve 175 is closed so that the injection of the heating steam to the back surface S2 is stopped (step S180). The injection of the heating steam to the back surface S2 may be once stopped before the start of step S160 and may be started again before the start of step S170, for example.

Subsequently to the processing of the step S180, the rinsing for the back surface S2 of the substrate W is carried out (step S190). More specifically, the on-off valve 178 is opened and the rinsing liquid is started to be supplied from the rinsing liquid supply source 133. Then, the rinsing liquid is discharged from the processing liquid discharging port 148 of the lower nozzle 141 to the back surface S2 of the substrate W so that the rinsing for the back surface S2 is carried out. When a predetermined time elapsed and the rinsing for the back surface S2 is completed, the on-off valve 178 is closed and the supply of the rinsing liquid is stopped.

Next, the rotation of the spin chuck 111 is continuously carried out for a predetermined time in a state in which the rotating speed of the spin chuck 111 is set to be a high rotating speed of 1000 rpm to 1500 rpm. Consequently, the rinsing liquid remaining in the upper surface peripheral edge part S3 is shaken off toward the outside of the substrate W by the action of centrifugal force so that a drying treatment (spin drying) for the upper surface S1 of the substrate W is carried out (step S200). In the spin drying, the nitrogen gas G1 is continuously supplied from the nitrogen gas injection nozzle 128 of the nitrogen gas injecting portion 124 to the upper surface peripheral edge part S3. Consequently, drying of the rinsing liquid adhering onto the upper surface peripheral edge part S3 is promoted, and furthermore, the shaken-off rinsing liquid can be prevented from returning to the substrate W side and adhering onto the non-processed region of the upper surface S1. Moreover, the nitrogen gas is injected from the processing liquid discharging port 148 of the lower nozzle 141 toward the back surface S2 so that the drying of the back surface S2 is promoted.

When a predetermined time elapsed since the start of the drying treatment, the rotation of the spin chuck 111 is stopped so that the drying treatment is ended (step S210). Subsequently, the on-off valve 171 and the on-off valve 177 are closed so that the injection of the nitrogen gas for purge from the nitrogen gas injecting portion 124 and the lower nozzle 141 is stopped (step S220).

When the injection of the gas from the nitrogen gas injecting portion 124 and the lower nozzle 141 is stopped, the control portion 151 controls the nozzle rotating mechanism 155 to move the nozzle unit 120 to the standby position. Then, the processed substrate W is removed from the spin chuck 111 and delivered to the outside of the processing chamber by means of a delivery robot (not shown) (step S230) so that the substrate processing to be carried out by the substrate processing device 100 is ended.

According to the substrate processing device in accordance with the present preferred embodiment configured as described above, the heating steam is injected to the central part of the back surface S2 of the substrate W so that the substrate W is entirely heated and the processing liquid is supplied to the peripheral edge part from above. Also in the case where the amount of the processing liquid to be supplied is small, consequently, it is possible to enhance reactivity of the processing liquid in the peripheral edge part by sufficiently heating the peripheral edge part. Accordingly, if the processing liquid is supplied from above to a desirable region having a small width at the substrate end side (the peripheral edge side) in the peripheral edge part, it is possible to reduce the etching width while suppressing deterioration in each of the uniformity of the etching width and the etching rate. Moreover, the heating steam is injected to the lower surface of the substrate W. Therefore, even if a water droplet is generated by the condensation of the steam, it is possible to suppress wraparound of the water droplet onto the upper surface of the substrate W. Accordingly, it is possible to prevent deterioration in the non-processed region from being caused by the adhering of the water droplet to the non-processed region on the upper surface of the substrate W. Moreover, since the non-processed region is hardly deteriorated due to the supply of the heating steam, it is possible to supply, to the back surface S2, the steam in an amount sufficient for heating the upper surface peripheral edge part S3 of the substrate W.

Moreover, according to the substrate processing device in accordance with the present preferred embodiment configured as described above, the steam injection nozzle 125 injects the heating steam to the back surface S2 of the substrate W via the supply tube 181 inserted into the inner part of the rotating support shaft 113 of the spin chuck 111. Consequently, it is possible to supply the heating steam to the back surface S2 while preventing the contact of the rotating chuck pin 117 and the steam injection nozzle 125 with a simple structure.

Furthermore, according to the substrate processing device in accordance with the present preferred embodiment configured as described above, the superheated steam having a high temperature is used as the heating steam. For this reason, it is possible to cause the upper surface peripheral edge part of the substrate W to have a higher temperature and to increase the etching rate more greatly as compared with the case where saturated steam having a temperature of 100° C. or less is used for the heat treatment, for example. It is also possible to save the processing liquid.

Furthermore, according to the substrate processing device in accordance with the present preferred embodiment configured as described above, the processing liquid discharging portion 122 can regulate the width in the radial direction of the substrate W in the portion in which the processing liquid collides with the upper surface peripheral edge part S3 by the control of the nozzle rotating mechanism 155. Consequently, it is possible to supply the processing liquid from above to the desirable region having a small width in the upper surface peripheral edge part S3 of the substrate W having the upper surface S1 heated. Therefore, it is possible to control the etching width with high precision irrespective of the rotating speed of the substrate W.

Although the present invention has been shown and described in detail, the description is illustrative in all aspects and is not restrictive. Therefore, the preferred embodiment according to the present invention can be appropriately changed and omitted within the scope of the present invention. For example, the nitrogen gas supply source 134 and the steam supply source 131 may be provided in the substrate processing device 100. It is also possible to employ a structure in which a dry gas such as dry air or an inert gas other than the nitrogen gas is supplied in place of the supply of the nitrogen gas through the nitrogen gas supply source 134. Moreover, although the respective nozzles or the like in the nozzle unit 120 are moved integrally with the substrate W, it is also possible to employ a structure in which they can be individually moved, respectively. Furthermore, among the back surface S2 and the upper surface peripheral edge part S3, even if the substrate processing device 100 supplies the processing liquid to only the upper surface peripheral edge part S3 to carry out the etching for only the upper surface peripheral edge part S3, the usefulness of the present invention is not lost. Moreover, even if the substrate processing device 100 is not provided with the nitrogen gas heater 138, the usefulness of the present invention is not lost.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method for carrying out a chemical treatment for a substrate by using a processing liquid having a reaction rate increased with a rise in temperature, the method comprising:
    a rotating step of holding a substrate in a substantially horizontal posture and rotating said substrate in a substantially horizontal plane;
    a heating step of injecting heating steam into a central part of a lower surface of said substrate to heat said substrate entirely, in parallel with said rotating step; and
    a peripheral edge processing step of supplying a processing liquid to a peripheral edge part of said substrate from above said peripheral edge part, thereby carrying out a chemical treatment for said peripheral edge part, in parallel with said heating step.

2. The substrate processing method according to claim 1, wherein said heating step injects said steam to said lower surface of said substrate via a supply tube inserted into a rotating support shaft of a substrate holding portion that holds said substrate in said substantially horizontal posture.

3. The substrate processing method according to claim 1, wherein said steam is superheated steam.

4. The substrate processing method according to claim 1, wherein said peripheral edge processing step regulates a width in a radial direction of said substrate in a portion in which said processing liquid collides with said peripheral edge part.

5. A substrate processing method for carrying out a chemical treatment for a substrate by using a processing liquid having a reaction rate increased with a rise in temperature, the method comprising:
    a rotating step of holding a substrate in a substantially horizontal posture and rotating said substrate in a substantially horizontal plane;
    a heating step of heating said substrate entirely by injecting heated steam into a central part of a lower surface of said substrate, in parallel with said rotating step; and
    a peripheral edge processing step of supplying a processing liquid to a peripheral edge part of said substrate from above said peripheral edge part, thereby carrying out a chemical treatment for said peripheral edge part, in parallel with said heating step.

6. The substrate processing method according to claim 5, wherein said steam injected into said central part of said lower surface of said substrate spreads from said central part toward said peripheral edge part along said lower surface of said substrate, thereby heating said substrate entirely.

7. A substrate processing method for carrying out a chemical treatment for a substrate by using a processing liquid having a reaction rate increased with a rise in temperature, the method comprising the steps of:
    a rotating step of holding a substrate in a substantially horizontal posture and rotating said substrate in a substantially horizontal plane; and
    a peripheral edge processing step of injecting heated steam into a central part of a lower surface of said substrate and supplying a processing liquid to above said peripheral edge part, thereby carrying out a chemical treatment for said peripheral edge part, in parallel with said rotating step.

* * * * *